(12) United States Patent
Gong et al.

(10) Patent No.: US 8,597,983 B2
(45) Date of Patent: *Dec. 3, 2013

(54) SEMICONDUCTOR DEVICE PACKAGING HAVING SUBSTRATE WITH PRE-ENCAPSULATION THROUGH VIA FORMATION

(75) Inventors: Zhiwei Gong, Chandler, AZ (US); Navjot Chhabra, Austin, TX (US); Glenn G. Daves, Austin, TX (US); Scott M. Hayes, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/299,564

(22) Filed: Nov. 18, 2011

(65) Prior Publication Data

US 2013/0127030 A1   May 23, 2013

(51) Int. Cl.
    *H01L 21/00*   (2006.01)
(52) U.S. Cl.
    USPC ............... 438/107; 257/676; 257/E21.502; 438/106
(58) Field of Classification Search
    USPC ............... 438/106, 107; 257/676, E21.502
    See application file for complete search history.

(56) References Cited

U.S. PATENT DOCUMENTS

| | | | |
|---|---|---|---|
| 3,865,458 A | | 2/1975 | Pauza et al. |
| 5,710,063 A | * | 1/1998 | Forehand et al. ............ 438/106 |
| 5,886,401 A | * | 3/1999 | Liu ............................. 257/678 |
| 6,081,989 A | | 7/2000 | Pluymers et al. |
| 6,271,057 B1 | * | 8/2001 | Lee et al. ...................... 438/106 |
| 6,372,619 B1 | * | 4/2002 | Huang et al. .................. 438/597 |
| 6,743,660 B2 | | 6/2004 | Lee et al. |
| 6,872,591 B1 | * | 3/2005 | Wang et al. ................... 438/106 |
| 6,876,066 B2 | | 4/2005 | Fee et al. |
| 7,030,469 B2 | | 4/2006 | Mahadevan et al. |
| 7,071,554 B2 | * | 7/2006 | Hussein et al. ............... 257/737 |
| 7,078,788 B2 | | 7/2006 | Vu et al. |
| 7,495,319 B2 | | 2/2009 | Fukuda et al. |
| 7,556,983 B2 | | 7/2009 | Kurita |
| 7,633,765 B1 | * | 12/2009 | Scanlan et al. ............... 361/760 |

(Continued)

OTHER PUBLICATIONS

U.S. Appl. No. 13/222,150, Inventor Zhiwei Gong, "Semiconductor Device Packaging Having Pre-Encapsulation Through VIA Formation", filed Aug. 31, 2011, Office Action—Restriction, mailed Sep. 20, 2012.

(Continued)

*Primary Examiner* — Jarrett Stark
*Assistant Examiner* — Nicholas Tobergte
(74) *Attorney, Agent, or Firm* — Jonathan N. Geld

(57) ABSTRACT

A method for forming through vias in a semiconductor device package prior to package encapsulation is provided. One or more signal conduits are formed through photolithography and metal deposition on a printed circuit substrate having interconnect pads. After removing photoresistive material, the semiconductor device package is built by encapsulating the signal conduits along with any semiconductor die, wire bonding, and other parts of the package. Free ends of each signal conduit are exposed and the signal conduits are used as through vias to provide signal-bearing pathways between connections from a top-mounted package to a printed circuit substrate interconnect and electrical contacts of the semiconductor die or package contacts. Using this method, signal conduits can be provided in a variety of geometric placings on the printed circuit substrate for inclusion in a semiconductor device package. A semiconductor device package incorporating the pre-fabricated through vias is also provided.

13 Claims, 4 Drawing Sheets

(56) References Cited

U.S. PATENT DOCUMENTS

| | | | |
|---|---|---|---|
| 7,671,457 | B1 | 3/2010 | Hiner et al. |
| 7,671,459 | B2 | 3/2010 | Corisis et al. |
| 7,678,612 | B2 | 3/2010 | Fujii et al. |
| 7,704,800 | B2 * | 4/2010 | Zhang .................. 438/126 |
| 7,799,603 | B2 * | 9/2010 | Tsai et al. ............. 438/106 |
| 7,812,457 | B2 | 10/2010 | Kurita |
| 7,838,420 | B2 | 11/2010 | Tang et al. |
| 7,842,542 | B2 | 11/2010 | Shim et al. |
| 7,863,098 | B2 | 1/2011 | Lange et al. |
| 7,863,729 | B2 | 1/2011 | Hsu et al. |
| 7,875,505 | B2 | 1/2011 | Wang |
| 7,892,962 | B2 | 2/2011 | Su |
| 7,989,950 | B2 | 8/2011 | Park et al. |
| 8,017,452 | B2 | 9/2011 | Ishihara et al. |
| 8,021,930 | B2 * | 9/2011 | Pagaila .................. 438/124 |
| 8,039,304 | B2 * | 10/2011 | Pagaila .................. 438/107 |
| 8,110,911 | B2 | 2/2012 | Ishihara et al. |
| 8,120,149 | B2 | 2/2012 | Camacho et al. |
| 8,227,338 | B1 | 7/2012 | Scanlan et al. |
| 8,227,927 | B2 | 7/2012 | Chen et al. |
| 8,242,601 | B2 | 8/2012 | Chou et al. |
| 8,273,660 | B2 | 9/2012 | Park et al. |
| 8,338,922 | B1 | 12/2012 | Sirinorakul et al. |
| 8,383,950 | B1 | 2/2013 | Huemoeller et al. |
| 2003/0090883 | A1 | 5/2003 | Asahi et al. |
| 2004/0195691 | A1 | 10/2004 | Moriyasu et al. |
| 2005/0012186 | A1 | 1/2005 | Zimmerman |
| 2005/0029642 | A1 | 2/2005 | Takaya et al. |
| 2005/0247665 | A1 | 11/2005 | Oi et al. |
| 2006/0012178 | A1 | 1/2006 | Finley et al. |
| 2006/0087044 | A1 | 4/2006 | Goller |
| 2006/0291029 | A1 * | 12/2006 | Lin et al. .............. 359/224 |
| 2007/0212865 | A1 | 9/2007 | Armine et al. |
| 2008/0224283 | A1 | 9/2008 | Pu et al. |
| 2009/0050994 | A1 | 2/2009 | Ishihara et al. |
| 2009/0057849 | A1 | 3/2009 | Tang et al. |
| 2009/0130801 | A1 | 5/2009 | Fukuda et al. |
| 2010/0006994 | A1 | 1/2010 | Shim et al. |
| 2010/0127386 | A1 | 5/2010 | Meyer-Berg |
| 2010/0200970 | A1 | 8/2010 | Zhang |
| 2011/0037154 | A1 | 2/2011 | Shim et al. |
| 2011/0065241 | A1 | 3/2011 | Lin et al. |
| 2011/0163435 | A1 | 7/2011 | Tsukamoto et al. |
| 2012/0168884 | A1 | 7/2012 | Yao et al. |
| 2012/0181874 | A1 | 7/2012 | Willkoker et al. |

OTHER PUBLICATIONS

U.S. Appl. No. 13/222,148, Inventor Zhiwei Gong, Semiconductor Device Packaging Having Pre-Encapsultion Through VIA Formation Using Lead Frames Attached Signal Conduits, filed Aug. 31, 2011, Office Action—Resriction, mailed Nov. 9, 2012.

U.S. Appl. No. 13/222,150, Inventor Zhiwei Gong, "Semiconductor Device Packaging Having Pre-Encapsulation Through VIA Formation", filed Aug. 31, 2011, Office Action—Rejection, mailed Dec. 6, 2012.

U.S. Appl. No. 13/222,148 Office Action mailed Jan. 7, 2013.

Office Action mailed Feb. 15, 2013 in U.S. Appl. No. 13/222,143.

Office Action mailed Apr. 26, 2013 in U.S. Appl. No. 13/222,150.

Office Action mailed Jun. 6, 2013 in U.S. Appl. No. 13/222,143.

Notice of Allowance mailed Jul. 10, 2013 in U.S. Appl. No. 13/222,150.

Office Action mailed Aug. 19, 2013 in U.S. Appl. No. 13/222,148.

Office Action mailed Sep. 13, 2013 in U.S. Appl. No. 13/222,150.

* cited by examiner

SEMICONDUCTOR DEVICE PACKAGING HAVING SUBSTRATE WITH PRE-ENCAPSULATION THROUGH VIA FORMATION

CROSS-REFERENCE TO RELATED APPLICATION(S)

This application is related to U.S. patent application Ser. No. 13/222,148, filed on Aug. 31, 2011, entitled "SEMICONDUCTOR DEVICE PACKAGING HAVING PRE-ENCAPSULATION THROUGH VIA FORMATION USING LEAD FRAMES WITH ATTACHED SIGNAL CONDUITS," naming Zhiwei Gong, Navjot Chhabra, Glenn G. Daves, and Scott M. Hayes as inventors, and assigned to the current assignee hereof, and to U.S. patent application Ser. No. 13/222,143, filed on Aug. 31, 2011, entitled "SEMICONDUCTOR DEVICE PACKAGING HAVING PRE-ENCAPSULATION THROUGH VIA FORMATION USING DROP-IN SIGNAL CONDUITS," naming Zhiwei Gong, Navjot Chhabra, Glenn G. Daves, and Scott M. Hayes as inventors, and assigned to the current assignee hereof, and to U.S. patent application Ser. No. 13/222,150, filed on Aug. 31, 2011, entitled "SEMICONDUCTOR DEVICE PACKAGING HAVING PRE-ENCAPSULATION THROUGH VIA FORMATION," naming Zhiwei Gong, Navjot Chhabra, Glenn G. Daves, and Scott M. Hayes as inventors, and assigned to the current assignee hereof.

BACKGROUND

1. Field

This disclosure relates generally to semiconductor device packaging, and more specifically, to providing through-package vias in an encapsulated device package by forming signal conduits prior to the encapsulation process.

2. Related Art

Semiconductor and other types of electronic devices are often encapsulated wholly or partly in resin to provide environmental protection and facilitate external connection to the devices. Subsequent to encapsulation, interconnect structures can be built up on one or both sides of the encapsulated devices. For packages having electrical contacts on both top and bottom surfaces (e.g., for package-on-package applications), through-vias are often made to provide contacts between bottom side and top side interconnect structures. Traditionally, through package vias are made after encapsulation using a drilling and filling/metallization process that includes steps for via drill, via fill/metallization, polish and taping, and so on. This process of post-encapsulation via formation introduces complexities to the manufacturing process that have a variety of manufacturing and reliability challenges (e.g., consistent integrity of the through via and reliable connection to the interface). Further, costs associated with materials, processes and additional tooling to generate the through vias can be high.

It is therefore desired to have a process for creation of through package vias before encapsulation. It is further desired that the mechanism for providing through vias allows for formation of the through via using photolithographic processes similar to substrate fabrication technology. For enhanced package-on-package connectivity, it is further desired that the pre-fabricated through vias be incorporated to a printed circuit substrate having interconnect pads. The printed circuit substrate will also permit incorporation of semiconductor devices needing either wire bond connections to a package interconnect or flip chip couplings (e.g., conductive balls) to the package interconnect.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

A method for forming signal conduits before encapsulation for incorporation as through vias in a semiconductor device package is provided. One or more signal conduits are formed through photolithography and metal deposition on a printed circuit substrate having interconnect pads. After removing photoresistive material, the semiconductor device package is built by encapsulating the signal conduits along with any semiconductor die, die-to-interconnect coupling (e.g., wire bonding), and other parts of the package. The free ends of each signal conduit are exposed and the signal conduits can then be used as through vias, providing signal-bearing pathways between connections from a top-mounted package to the printed circuit substrate interconnect and electrical contacts of the semiconductor die or contacts on the bottom of the package. Using this method, signal conduits can be provided in a variety of geometric placings on the printed circuit substrate for inclusion in a semiconductor device package.

For convenience of explanation, and not intended to be limiting, the present invention is described for semiconductor devices, but persons of skill in the art will understand that the present invention applies to any type of electronic or optoelectronic device that is substantially planar. Accordingly, such other types of devices including the non-limiting examples given below, are intended to be included in the terms "device," "semiconductor device," and "integrated circuit" whether singular or plural, and the terms "device," "die," and "chip" are intended to be substantially equivalent. Non-limiting examples of suitable devices are semiconductor integrated circuits, individual semiconductor devices, piezoelectric devices, solid-state filters, magnetic tunneling structures, integrated passive devices such as capacitors, resistors and inductors, and combinations and a raise of any and all of these types of devices and elements. Further, embodiments of the present invention do not depend upon the types of die or chips being used nor the materials of which they are constructed provided that such materials withstand the encapsulation process.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
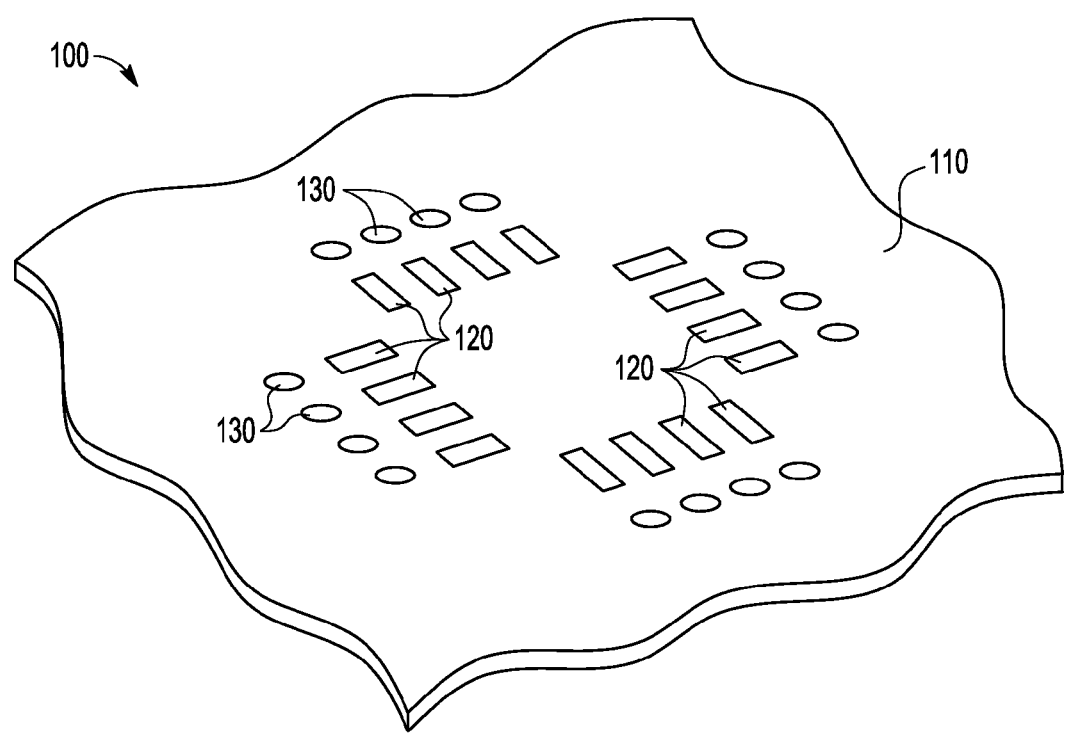
FIG. 1 is a simplified block diagram illustrating a perspective view of a printed circuit substrate usable with embodiments of the present invention.

FIG. 1 is a simplified block diagram illustrating a perspective view of a printed circuit substrate usable with embodiments of the present invention. Printed circuit substrate 100 can be made from a variety of materials standard in the art of semiconductor packaging and suitable to the application, including one or more dielectric layers 110. Typical dielectric materials for the substrate include woven glass and epoxy compounds that provide both electrical insulation as well as dimensional stability. The illustrated portion of printed circuit substrate 100 also includes die connection pads 120 for connecting die electrical contacts to an interconnect formed on and within the printed circuit substrate. The illustrated printed circuit substrate also includes via pads 130 for connecting through package vias to the interconnect, as will be discussed more fully below. Conductive materials used to form die connection pads 120 and via pads 130, as well as the interconnect within the printed circuit substrate, are typical of those used in the art and include, for example, copper foil.

Figure 2:
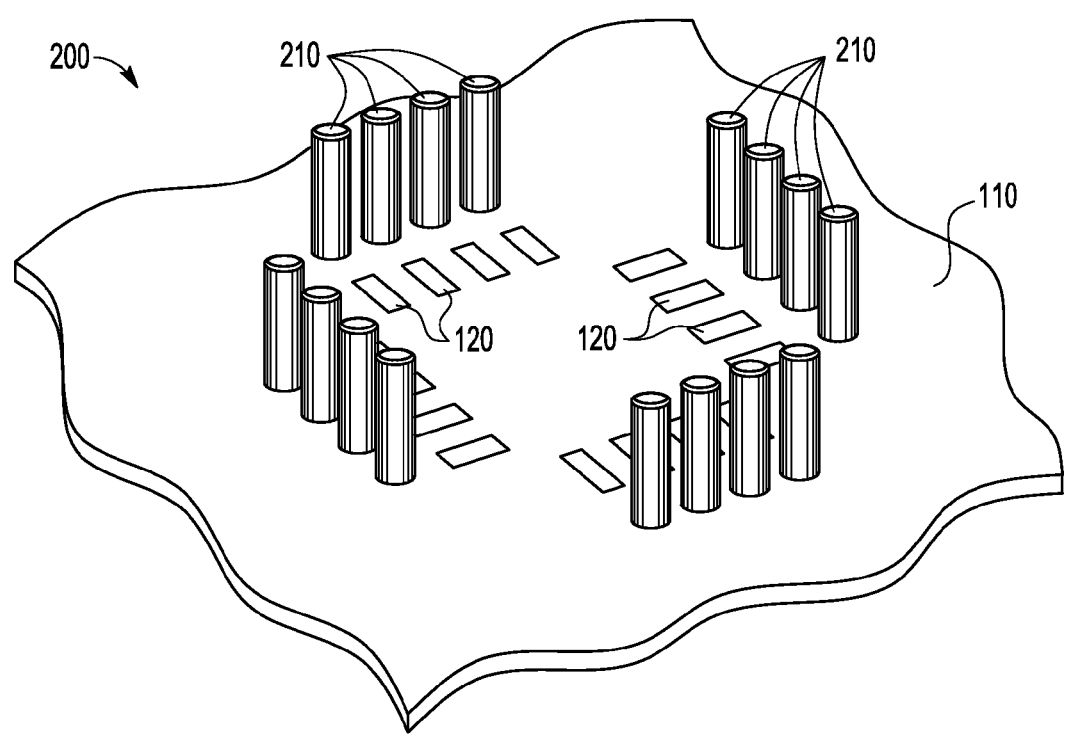
FIG. 2 is a simplified block diagram illustrating a perspective view of an assembly having signal conduits formed on the via pads of the printed circuit substrate, in accord with one embodiment of the present invention.

FIG. 2 is a simplified block diagram illustrating a perspective view of assembly 200 having signal conduits formed on the via pads of the printed circuit substrate, in accord with one embodiment of the present invention. The portion of printed circuit substrate 100 is shown with conductive signal conduits 210 formed on the via pads 130 at a major surface of the printed circuit substrate. It should be understood that assembly 200 is one region of the printed circuit substrate and that a larger area assembly can used to fabricate a panel (e.g., a grid layout). Further, embodiments of the present invention are not limited to a particular configuration of electrical contacts or number of signal conduits. As will be discussed more fully below, signal conduits 210 can be formed from any material suitable to the application. Embodiments of the present invention use a metal plating process to form the signal conduits. The following figures illustrate an example of a plating process for forming electrically-conductive signal conduits.

Figure 3:
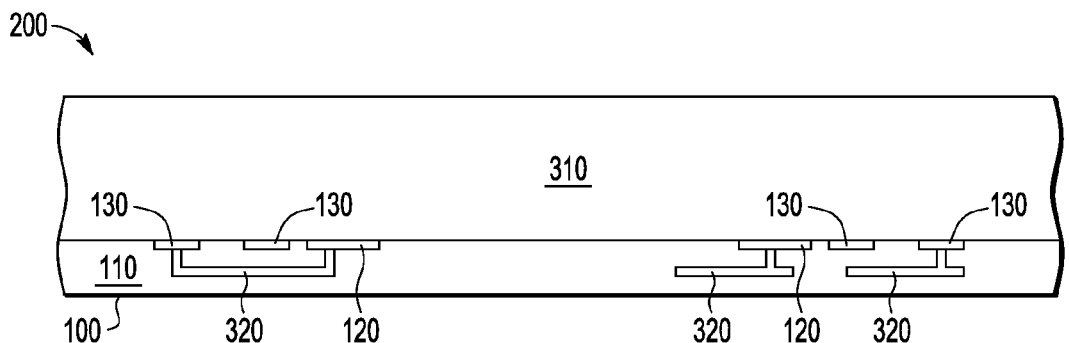
FIG. 3 is a cross sectional view of a portion of the assembly at a stage of processing to form the signal conduits on the printed circuit substrate.

FIG. 3 is a cross sectional view of a portion of assembly 200 at a stage of processing to form the signal conduits on the printed circuit substrate. Printed circuit substrate 100 is provided and a photolithographic material layer 310 is deposited on the substrate. Photolithographic material layer 310 should be deposited to a thickness sufficient to form the signal conduits that will ultimately be used as through vias in the semiconductor package. In typical applications, it can be desirable to have conductive through vias of between approximately 50 microns to 2 millimeters, depending upon the nature of the application. In one embodiment, the thickness of the photolithographic material layer is approximately 500 microns thick.

Photolithographic material layer 310 can be made from a variety of materials such as photoresist or a dry film lamination layer. The photolithographic materials chosen for the application should be sufficient to support formation of signal conduit features having aspect ratios of as much as 5:1 between height of the feature (or thickness of the photolithographic material layer) and diameter/width of the feature. That is, expected shape and dimensions of the signal conduit are maintained throughout the thickness of the photoresist. In one embodiment, signal conduit feature aspect ratios are approximately 3:1. Examples of photolithographic materials capable of supporting such aspect ratios include DUPONT MPF dry film and microlithographic polymer film or resist materials.

FIG. 3 further illustrates portions of a conductive interconnect 320 within printed circuit substrate 100. These portions of the interconnect are coupled to wire bond pads 120 and through via pads 130. Interconnect 320 illustrated in FIG. 3 is provided only by way of example, and it should be realized that the interconnects formed can extend not only across the page as illustrated but also into and above the page. The interconnect also provides contacts on the major surface of the printed circuit substrate that faces away from the photolithographic material layer so that contacts external to the ultimate packaged device can be provided.

Figure 4:
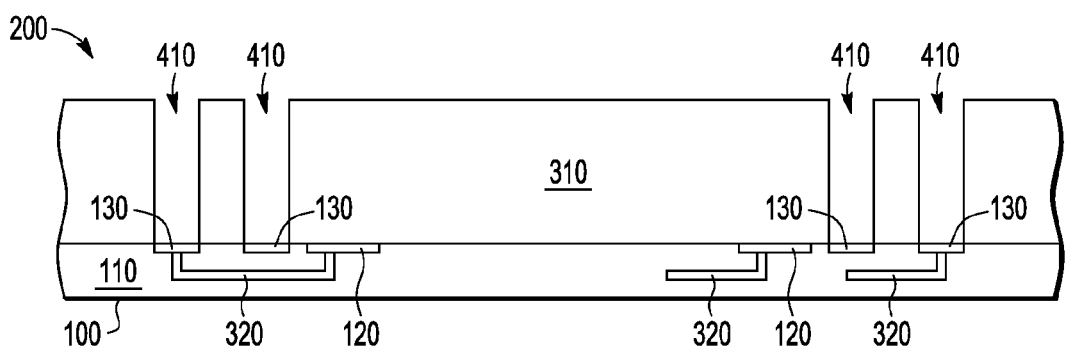
FIG. 4 is a simplified block diagram of the assembly at a later stage in processing, according to one embodiment of the present invention.

FIG. 4 is a simplified block diagram of assembly 200 at a later stage in processing, according to one embodiment of the present invention. Photolithographic material layer 310 is patterned through standard techniques to form columnar holes 410 in which the signal conduits will be formed. Holes 410 can have any cross-sectional shape desirable for the application. Holes 410 can be patterned and formed such that the holes provide access to corresponding through via pads 130.

Figure 5:
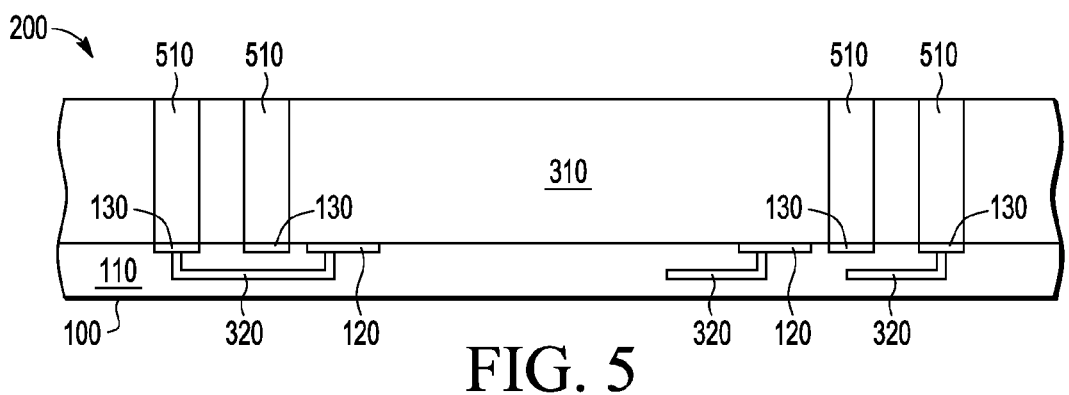
FIG. 5 is a simplified block diagram illustrating the cross sectional view of the assembly at a later stage in processing, according to an embodiment of the present invention.

FIG. 5 is a simplified block diagram illustrating the cross sectional view of assembly 200 at a later stage in processing, according to an embodiment of the present invention. Conductive signal conduits are formed by applying a plated conductive layer 510 that forms the signal conduits in holes 410. Plated conductive layer 510 can include generally any conductive material, such as, but not limited to, aluminum, copper, tantalum, titanium, tungsten, or any metal alloy, nitride or silicide thereof. Plated conductive layer 510 is formed such that an electrically conductive path is made with a through via pad 130 corresponding to the hole. A conductive layer 510 is not limited to application by plating, but can also be applied by any other appropriate techniques (e.g., printing).

Figure 6:
FIG. 6 is a simplified block diagram illustrating the cross sectional view of the assembly at a later stage in processing, according to an embodiment of the present invention.

FIG. 6 is a simplified block diagram illustrating the cross sectional view of assembly 200 at a later stage in processing, according to an embodiment of the present invention. Subsequent to plating, a photoresist and/or dry film strip process is performed to remove the photolithographic material layer. Subsequent to stripping, printed circuit substrate 100 and signal conduits 210 (as formed from the plating process) remain. The assembly illustrated in FIG. 6 as a cross-section can resemble assembly 200 illustrated in FIG. 2, or provide any geometry appropriate to the application. Subsequent processing can now include associating assembly 200 with various device die in an encapsulation process.

It should be understood that the geometries and configurations provided herein are made by way of example and are not intended to limit the nature or applications of embodiments of the present invention.

Figure 7:
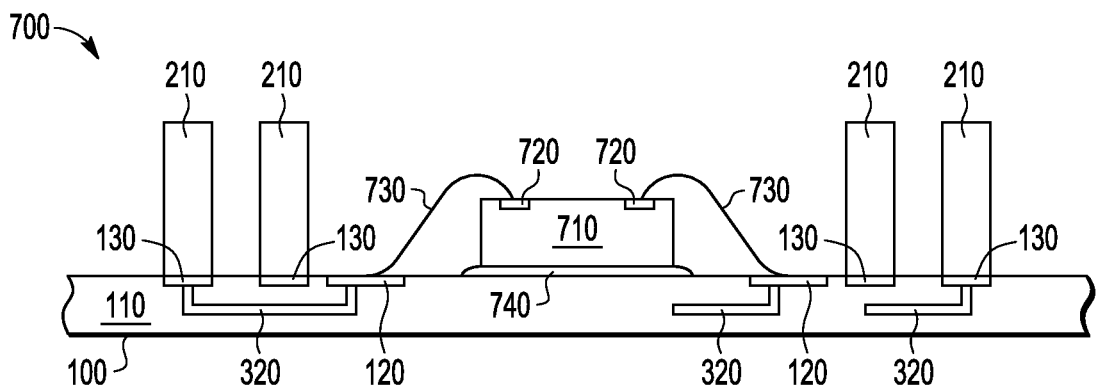
FIG. 7 is a simplified block diagram illustrating a cross-sectional view of a device structure at a stage in one example of processing, according to an embodiment of the present invention.

FIG. 7 is a simplified block diagram illustrating a cross-sectional view of a device structure 700 at a stage in one example of processing, according to an embodiment of the present invention. Assembly 200 with printed circuit substrate 100 and signal conduits 210 is provided. At least a die 710 is affixed on printed circuit substrate 100. As illustrated, die 710 is affixed with an active surface exposed (e.g., facing away from the surface of the printed circuit substrate). The "active surface" of die 710 is a surface of the die having bond pads 720. Die 710 can be attached to printed circuit substrate 100 using an adhesive layer 740 that can withstand the packaging processing without separating from either the die or the printed circuit substrate. In addition, die bond pads 720 are coupled to wire bond pads 120 through associated wire bonds 730 formed using wire bonding techniques known in the art and suitable to the application.

It should further be noted that embodiments of the present invention do not depend on the exact nature of the components incorporated in the device structure (e.g., die 710). The component can be, for example, integrated circuits, individual devices, filters, magnetostrictive devices, electro-optical devices, electro-acoustic devices, integrated passive devices such as resistors, capacitors and inductors, or other types of elements and combinations thereof, and can be formed of any materials able to withstand the encapsulation process. Non-limiting examples of materials are various organic and inorganic semiconductors, type IV, III-V and II-VI materials, glasses, ceramics, metals, semi-metals, intermetallics and so forth.

Further, it should be noted that embodiments of the present invention do not depend on the exact nature of the packaging of die 710. As illustrated, die 710 is a wire bond package coupled to wire bond pads 120 using wire bonding techniques. Alternatively, die 710 can be provided in a flip chip type package. Conductive pads can be formed on printed circuit substrate 100 to conductively couple with connective elements on the flip chip die (e.g., conductive balls).

Figure 8:
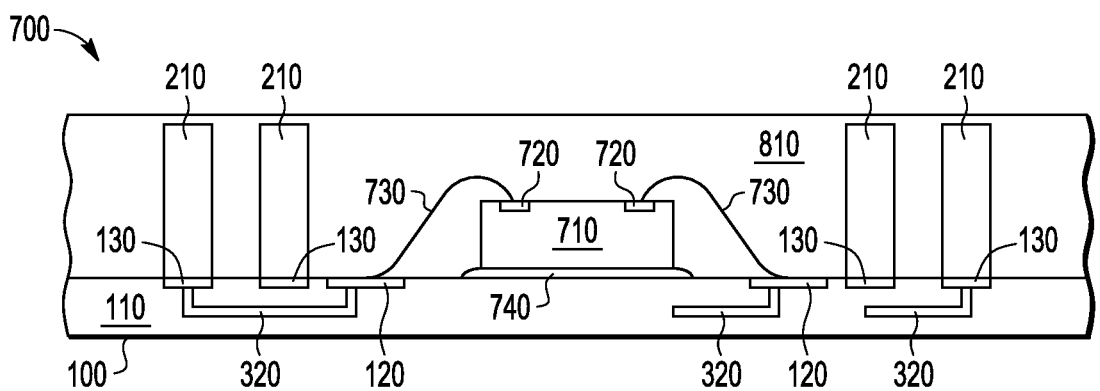
FIG. 8 is a simplified block diagram illustrating the cross sectional view of the device structure at a later stage in the processing example.

FIG. 8 is a simplified block diagram illustrating the cross sectional view of device structure 700 at a later stage in the processing example. A molding material is applied to the structures affixed to printed circuit substrate 100 (e.g., signal conduits 210 and die 710), forming an encapsulant 810 that encapsulates the structures within the molding material and forms a panel or a strip with multiple packages. The molding material can be any appropriate encapsulant including, for example, silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding and spin application. Once the molding material is applied, the panel or strip can be cured by exposing the materials to certain temperatures for a period of time, or by applying curing agents, or both. In a typical encapsulation process, a depth of encapsulant 810 can exceed a maximum height of structures embedded in the molding material (e.g., the height of signal conduits 210 as illustrated in FIG. 8).

Figure 9:
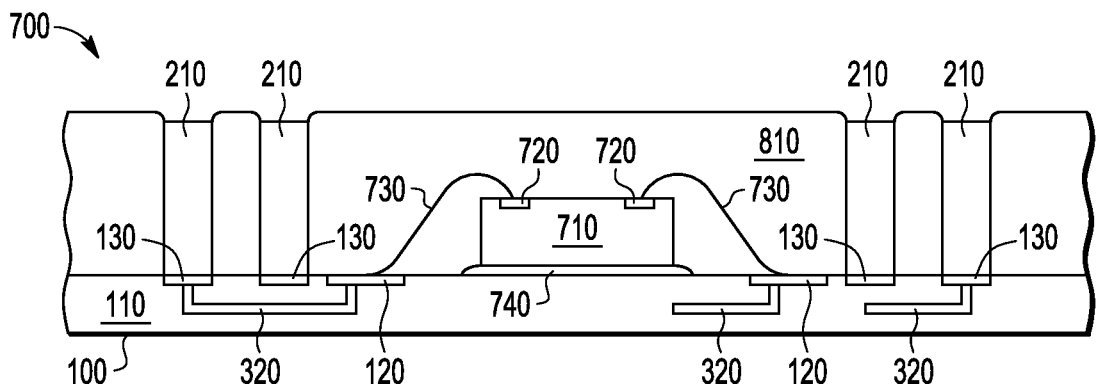
FIG. 9 is a simplified block diagram illustrating the cross sectional view of the device structure at a later stage in the processing example.

FIG. 9 is a simplified block diagram illustrating the cross sectional view of device structure 700 at a later stage in the processing example. Encapsulant 810 is reduced in thickness to expose the ends of signal conduits 210. This reduction in thickness of the encapsulant and exposing of the ends of the signal conduits can be performed by laser ablation, or other conventional techniques (e.g., grinding or chemical etching). Alternatively, the encapsulant can be formed to the appropriate thickness during the encapsulation process by, for example, compression molding with film applied to control encapsulant thickness to that of the signal conduits or thinner (i.e., forming a stud-type structure above the surface of the panel).

At this point, it can be seen that signal conduits 210 form conductive vias between the top major surface of the encapsulated panel or strip to printed circuit substrate 100. These through vias can be used to enable electrical connection between interconnect structures in the printed circuit substrate and/or pads formed on the bottom and top of packages formed from the panel or strip, thereby allowing package-on-package implementations.

Figure 10:
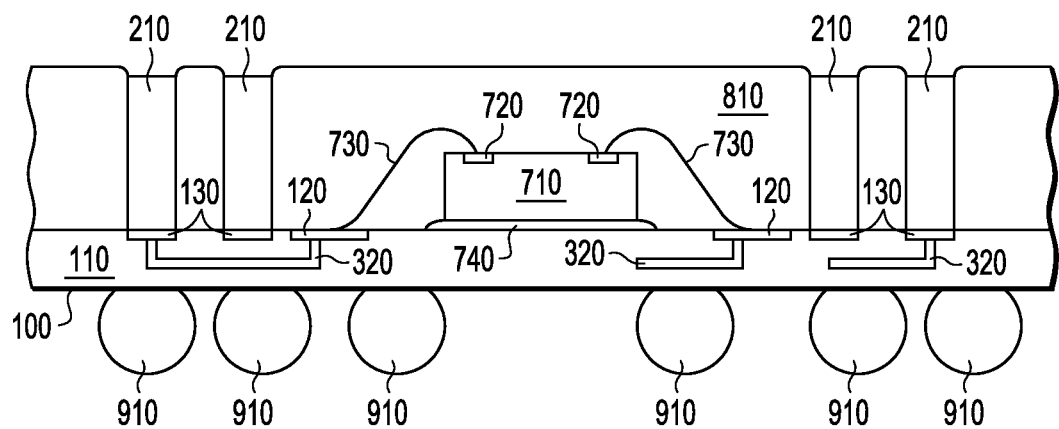
FIG. 10 is a simplified block diagram illustrating the cross sectional view of the device structure after ball placement and singulation.

FIG. 10 is a simplified block diagram illustrating the cross sectional view of device structure 700 after ball placement and singulation. Processing providing the various layers illustrated in FIG. 10 can be provided by standard techniques used in semiconductor packaging. As illustrated, a set of conductive ball connectors can be provided by forming and placing conductive balls 910 on contact pads provided by interconnect 320 in the printed circuit substrate, using standard techniques and materials.

In addition, conductive balls can also be formed on the through vias formed by the conductive signal conduits. Under bump metallization can be performed during formation of conductive signal conduits 210 to enable conductive ball formation and attachment.

Components can be mounted directly onto the top side of the package and electrically connected to the top ends of the through vias formed by signal conduits 210. In this manner, three-dimensional packaging can be performed.

If desired for the application, the finishing process for top and bottom side interconnects can be performed and then individual semiconductor packages can be separated from the panel using a singulation process.

The signal conduits of the present invention allow for forming through vias prior to encapsulation. Conduits can be formed in the manner shown before a pick and place process. Other components, such as die, can be placed at a later stage. This allows for great flexibility in through via placement. The signal conduits are embedded in the package during the encapsulation process. The signal conduits are then exposed using methods such as laser ablation, grinding, etching or controlling the encapsulant to the appropriate thickness with, for example, compression molding. Subsequent processing (e.g., surface mount) of the encapsulated device can use the signal conduits as through package connections (e.g. through vias).

The processes of the present invention save the need for post-encapsulation via drilling and filling steps. The process provides consistent quality signal paths through the depth of the package that do not depend upon a quality of a fill operation.

By now it should be appreciated that one embodiment of the present invention provides for packaging an electronic device assembly using a method including providing a printed circuit substrate having an interconnect, forming one or more signal conduits on the printed circuit substrate in which a first end of each signal conduit contacts a conductive pad on a major surface of the printed circuit substrate and the conductive pad is coupled to the interconnect, forming an encapsulant over and around sides of the one or more signal conduits, and exposing a second end of each signal conduit of the one or more signal conduits where each signal conduit forms a conductive via through the electronic device assembly. In one aspect of the above embodiment, forming the one or more signal conduits includes forming a photoresist layer over the printed circuit substrate, forming one or more openings in the photoresist layer corresponding to where the one or more signal conduits are desired, depositing a conductive material in the openings in the photoresist layer, and stripping the photoresist layer from the printed circuit substrate. If desired, a further aspect includes performing an under bump metallization, before stripping the photoresist, on one or more of the one or more signal conduits.

In another aspect of the above embodiment, exposing the second end of each signal conduit includes controlling the forming of the encapsulant to a thickness less than or equal to a length of the signal conduits. In still another aspect of the above embodiment, exposing the second end of each signal conduit includes laser ablating the encapsulant from an area around the second end of each signal conduit.

Another aspect of the above embodiment includes placing a first electronic device on the printed circuit substrate in an area for the electronic device assembly where forming the encapsulant further includes forming the encapsulant over and around sides of the first electronic device. A further aspect includes electrically coupling the first electronic device to the interconnect prior to forming the encapsulant. In still a further aspect, electrically coupling includes forming a wire bond from a contact pad of the first electronic device to wire bond pads formed on the major surface of the printed circuit substrate. In another aspect, electrically coupling includes contacting a conductive pad of the first electronic device to pads formed on the major surface of the printed circuit substrate.

Another aspect of the above embodiment includes placing a second electronic device assembly on the exposed second end of one or more signal conduits such that the second electronic device assembly is electrically coupled to the one or more signal conduits.

Another embodiment of the present invention includes a packaged device assembly having an electronic device, one or more conductive vias extending from a top surface of the packaged device assembly to a bottom surface of the packaged device assembly, and encapsulant over and around the electronic device and the conductive vias which forms an encapsulated region of the packaged device assembly. The one or more conductive vias are formed using corresponding signal conduits, where each signal conduit is formed before encapsulating the electronic device and signal conduits. Forming each signal conduit includes patterning openings in a photoresist layer formed over a printed circuit substrate having an interconnect, depositing a conductive material in the openings in the photoresist layer, and stripping the photoresist layer from the printed circuit substrate. Each signal conduit contacts a corresponding conductive pad on a major surface of the printed circuit substrate.

In one aspect of the above embodiment, the packaged device assembly further includes the interconnect coupling a first contact on the first electronic device to a signal conduit of the one or more signal conduits. A further aspect includes a wire bond coupling the first contact on the first electronic device to the interconnect. Another aspect includes a flip chip coupling the first contact on the first electronic device to the interconnect.

In another aspect of the above embodiment the conductive vias are configured to receive a second electronic device assembly.

Another embodiment is a method for packaging an electronic device assembly including forming a photoresist layer on a printed circuit substrate, forming one or more openings in the photoresist layer where the one or more openings extend from the surface of the photoresist layer to contacts on the printed circuit substrate, depositing a conductive material in the openings in the photoresist layer to form corresponding one or more signal conduits, stripping the photoresist layer from the printed circuit substrate and the signal conduits, and forming an encapsulant over and around sides of the one or more signal conduits and over the printed circuit substrate. One aspect of the above embodiment further includes placing an electronic device on the printed circuit substrate in an area for the electronic device assembly after stripping the photoresist layer from the printed circuit substrate, and forming the encapsulant over and around sides of the electronic device.

Another aspect of the above embodiment further includes exposing an end of the one or more signal conduits where exposing the ends includes removing a portion of the encapsulant from the electronic device assembly. A further aspect provides for removing the portion of the encapsulant by laser ablating the encapsulant from the electronic device assembly to a depth at least matching the end of the signal conduits. Another further aspect provides for removing the portion of the encapsulant by grinding the encapsulant from the electronic device assembly to a depth at least matching the end of the signal conduits. Another further aspect provides for removing a portion of the encapsulant by etching the encapsulant from the electronic device assembly to a depth at least matching the end of the signal conduits.

Because the apparatus implementing the present invention is, for the most part, composed of electronic components and circuits known to those skilled in the art, circuit details are not explained in any greater extent than that considered necessary as illustrated above, for the understanding and appreciation of the underlying concepts of the present invention and in order not to obfuscate or distract from the teachings of the present invention.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for packaging an electronic device assembly, the method comprising:
    providing a printed circuit substrate having an interconnect;
    forming one or more signal conduits on the printed circuit substrate, wherein
        a first end of each signal conduit contacts a conductive pad on a major surface of the printed circuit substrate, and
        the conductive pad is coupled to the interconnect;
    forming an encapsulant over and around sides of the one or more signal conduits, wherein said forming the encapsulant is performed subsequent to said forming the one or more signal conduits; and
    exposing a second end of each signal conduit of the one or more signal conduits, wherein each signal conduit forms a conductive via through the electronic device assembly.

2. The method of claim 1 wherein said forming the one or more signal conduits comprises:
    forming a photoresist layer over the printed circuit substrate;
    forming one or more openings in the photoresist layer corresponding to where the one or more signal conduits are desired;
    depositing a conductive material in the openings in the photoresist layer; and
    stripping the photoresist layer from the printed circuit substrate.

3. The method of claim 2 further comprising:
    performing an under bump metallization on one or more of the one or more signal conduits, wherein said under bump metallization is performed prior to said forming the encapsulant.

4. The method of claim 1 wherein said exposing the second end of each signal conduit comprises controlling said forming the encapsulant to a thickness less than or equal to a length of the signal conduits.

5. The method of claim 1 wherein said exposing the second end of each signal conduit comprises laser ablating the encapsulant from an area around the second end of each signal conduit.

6. The method of claim 1 further comprising:
    placing a first electronic device on the printed circuit substrate in an area for the electronic device assembly, wherein
        said forming the encapsulant further comprises forming the encapsulant over and around sides of the first electronic device.

7. The method of claim 6 further comprising:
    electrically coupling the first electronic device to the interconnect prior to said forming the encapsulant.

8. The method of claim 7 wherein said electrically coupling comprises forming a wire bond from a contact pad of the first electronic device to a wire bond pad formed on the major surface of the printed circuit substrate.

9. The method of claim 7 wherein said electrically coupling comprises contacting a conductive pad of the first electronic device to a pad formed on the major surface of the printed circuit substrate.

10. The method of claim 1 further comprising:
    placing a second electronic device assembly on the exposed second end of one or more signal conduits such that the second electronic device assembly is electrically coupled to the one or more signal conduits.

11. A method for packaging an electronic device assembly, the method comprising:
    forming a photoresist layer on a printed circuit substrate;
    forming one or more openings in the photoresist layer, wherein the one or more openings extend from the surface of the photoresist layer to contacts on the printed circuit substrate;
    depositing a conductive material in the openings in the photoresist layer to form corresponding one or more signal conduits;
    stripping the photoresist layer from the printed circuit substrate and the signal conduits; and
    forming an encapsulant over and around sides of the one or more signal conduits and over the printed circuit substrate; and
    exposing an end of the one or more signal conduits, wherein said exposing the end comprises removing a portion of the encapsulant from the electronic device assembly.

12. The method of claim 11 further comprising:
    placing an electronic device on the printed circuit substrate in an area for the electronic device assembly, after said stripping the photoresist layer from the printed circuit substrate; and
    forming the encapsulant over and around sides of the electronic device.

13. The method of claim 11 wherein said removing the portion of the encapsulant comprises one of:
    laser ablating the encapsulant from the electronic device assembly to a depth at least matching the end of the signal conduits,
    grinding the encapsulant from the electronic device assembly to a depth at least matching the end of the signal conduits, or
    etching the encapsulant from the electronic device assembly to a depth at least matching the end of the signal conduits.

* * * * *